United States Patent
Lang et al.

(10) Patent No.: US 9,601,721 B2
(45) Date of Patent: Mar. 21, 2017

(54) ENCAPSULATION FOR AN ORGANIC ELECTRONIC DEVICE

(71) Applicant: OSRAM Opto Semiconductors GmbH, Regensburg (DE)

(72) Inventors: Erwin Lang, Regensburg (DE); Richard Baisl, Regensburg (DE); Tilman Schlenker, Nittendorf (DE); Doreen Heppner, Koefering (DE); Michael Popp, Freising (DE); Evelyn Trummer-Sailer, Mintraching (DE)

(73) Assignee: OSRAM OLED GmbH, Regensburg (DE)

( * ) Notice: Subject to any disclaimer, the term of this patent is extended or adjusted under 35 U.S.C. 154(b) by 51 days.

(21) Appl. No.: 14/351,090

(22) PCT Filed: Oct. 11, 2012

(86) PCT No.: PCT/EP2012/070134
§ 371 (c)(1),
(2) Date: Apr. 10, 2014

(87) PCT Pub. No.: WO2013/053805
PCT Pub. Date: Apr. 18, 2013

(65) Prior Publication Data
US 2014/0246665 A1 Sep. 4, 2014

(30) Foreign Application Priority Data
Oct. 11, 2011 (DE) .................. 10 2011 084 276

(51) Int. Cl.
*H01L 51/56* (2006.01)
*H01L 51/52* (2006.01)
(Continued)

(52) U.S. Cl.
CPC ............ *H01L 51/56* (2013.01); *H01L 51/524* (2013.01); *H01L 51/5253* (2013.01);
(Continued)

(58) Field of Classification Search
None
See application file for complete search history.

(56) References Cited

U.S. PATENT DOCUMENTS 8,399,270 B2  3/2013 Cho et al.
9,000,443 B2  4/2015 Hatano
(Continued)

FOREIGN PATENT DOCUMENTS

CN 1894790 A 1/2007
CN 1992371 A 7/2007
(Continued)

OTHER PUBLICATIONS

Egelkraut, S., et al., "Wärmeleitfähige Kunststoffe für Entwärmungsaufgaben," Fraunhofer Institut Integrierte Systeme and Bauelementetechnologie, Jul. 15, 2008, pp. 1-14.
(Continued)

*Primary Examiner* — Calvin Choi
*Assistant Examiner* — Xiaoming Liu
(74) *Attorney, Agent, or Firm* — Slater Matsil, LLP

(57) ABSTRACT

An organic electronic device and a method of making an organic electronic device are provided. An embodiment of an electronic device includes a substrate, an active layer disposed on the substrate and a thin-layer encapsulation disposed on the active layer. The device further includes a first adhesive layer disposed on the thin-layer encapsulation, wherein the first adhesive layer comprises a getter material and a covering layer disposed on the first adhesive layer.

12 Claims, 5 Drawing Sheets

(51) Int. Cl.
*H01L 51/10* (2006.01)
*H01L 51/44* (2006.01)

(52) U.S. Cl.
CPC ........ *H01L 51/5259* (2013.01); *H01L 51/107* (2013.01); *H01L 51/448* (2013.01); *H01L 51/529* (2013.01); *H01L 51/5246* (2013.01); *H01L 51/5268* (2013.01)

(56) References Cited

U.S. PATENT DOCUMENTS

| | | | |
|---|---|---|---|
| 2003/0218422 A1 | 11/2003 | Park et al. | |
| 2004/0108811 A1 | 6/2004 | Klausmann et al. | |
| 2005/0045900 A1* | 3/2005 | Silvernail | H01L 51/5237 257/99 |
| 2005/0238803 A1 | 10/2005 | Tremel et al. | |
| 2007/0152212 A1 | 7/2007 | Cho et al. | |
| 2008/0018230 A1* | 1/2008 | Yamada | B32B 27/00 313/498 |
| 2009/0079328 A1 | 3/2009 | Fedorovskaya et al. | |
| 2010/0013384 A1* | 1/2010 | Song | H01L 51/5237 313/504 |
| 2010/0157585 A1* | 6/2010 | Diekmann | F21S 6/002 362/228 |
| 2010/0213308 A1 | 8/2010 | Suzuki | |
| 2011/0025196 A1 | 2/2011 | Rakuff et al. | |
| 2011/0127570 A1 | 6/2011 | Um et al. | |
| 2011/0217809 A1* | 9/2011 | Li | C09D 11/36 438/72 |
| 2012/0132953 A1 | 5/2012 | Becker et al. | |
| 2012/0139001 A1 | 6/2012 | Eberhardt et al. | |

FOREIGN PATENT DOCUMENTS

| | | |
|---|---|---|
| DE | 102007038324 A1 | 2/2009 |
| DE | 102007063656 A1 | 7/2009 |
| DE | 102008019900 A1 | 8/2009 |
| DE | 102008025755 A1 | 12/2009 |
| DE | 102008031405 A1 | 1/2010 |
| DE | 102008048472 A1 | 3/2010 |
| DE | 102008063636 A1 | 6/2010 |
| DE | 102009036968 A1 | 2/2011 |
| EP | 1383182 A2 | 1/2004 |
| EP | 1770799 A2 | 4/2007 |
| EP | 1804310 A2 | 7/2007 |
| JP | H05290976 A | 11/1993 |
| JP | H09274990 A | 10/1997 |
| JP | 2007042467 A | 2/2007 |
| JP | 2007184279 A | 7/2007 |
| JP | 2009076436 | 4/2009 |
| JP | 200999417 A | 5/2009 |
| JP | 2009129723 A | 6/2009 |
| JP | 2009134984 A | 6/2009 |
| JP | 201080293 A | 4/2010 |
| JP | 2011171288 A | 9/2011 |
| JP | 2013501312 A | 1/2013 |
| WO | 2007008774 A1 | 1/2007 |
| WO | 2010048920 A1 | 5/2010 |
| WO | 2010079038 A1 | 7/2010 |
| WO | 2010122113 A1 | 10/2010 |
| WO | 2011014307 A1 | 2/2011 |
| WO | 2011016408 A1 | 2/2011 |
| WO | 2011068092 A1 | 6/2011 |
| WO | 2012060621 A2 | 5/2012 |

OTHER PUBLICATIONS

"ZeoGlue Active edge sealant," SAES Getters, 2010, pp. 1-2, www.saesgetters.com.

* cited by examiner

ENCAPSULATION FOR AN ORGANIC ELECTRONIC DEVICE

This patent application is a national phase filing under section 371 of PCT/EP2012/070134, filed Oct. 11, 2012, which claims the priority of German patent application 10 2011 084 276.4, filed Oct. 11, 2011, each of which is incorporated herein by reference in its entirety.

TECHNICAL FIELD

The invention relates to an encapsulation for an organic electronic device, an organic electronic device having the encapsulation and a method for producing an organic electronic device having the encapsulation.

BACKGROUND

Organic electronic devices, such as, e.g., organic light-emitting diodes (OLEDs) are extraordinarily sensitive to moisture and oxygen.

In order to protect against moisture and oxygen, thin-layer encapsulations having thin layers are known. This type of thin-layer encapsulation is described, e.g., in German patent application 10 2008 048 472.

SUMMARY OF THE INVENTION

Embodiments of the present invention provide an improved encapsulation for an organic electronic device. Further embodiments of the present invention provide an organic electronic device having this type of encapsulation, and a method for producing this type of organic electronic device.

Advantageous embodiments and developments of the present invention are described in the respectively dependent claims.

The subject matter of one embodiment of the invention is an encapsulation for an organic electronic device having a layer sequence which comprises the following layers:
  at least one thin-layer encapsulation,
  at least one first adhesive layer arranged on the at least one thin-layer encapsulation, wherein the first adhesive layer comprises at least one getter material, and
  a covering layer arranged on the first adhesive layer.

Against expectation, the inventors have established that by using an adhesive layer having at least one getter material, on the one hand effective adhesion of the thin-layer encapsulation to the covering layer is achieved, but on the other hand this encapsulation serves to achieve an increased service life of electronic devices in comparison with devices, of which the encapsulation is provided with an adhesive layer which does not have a getter material. In particular, the first adhesive layer having at least one getter material in combination with the thin-layer encapsulation and the covering layer can lead to a retardation in oxygen and water diffusion and can effectively cover any pinholes in the thin-layer encapsulation.

The fact that a first layer or a first element is arranged or applied "on" or "above" a second layer or a second element or even "between" two further layers or elements, can mean in this case and hereinafter that the first layer or the first element is arranged immediately in direct mechanical and/or electrical contact on the second layer or the second element or with respect to the two further layers or elements. Furthermore, an immediate contact can also be defined, in which further layers and/or elements are arranged between the first layer or the first element of the second layer or the second element or the two further layers or elements.

In the present case, the term "encapsulation" is understood to refer to an apparatus which is suitable for forming a barrier against atmospheric substances, in particular moisture and oxygen. In other words, the encapsulation is formed in such a manner that it can be penetrated at the most by very small proportions of atmospheric substances, such as water or oxygen, or air and moisture diffusion is retarded considerably in comparison with previous encapsulations.

A "getter material" is a material which absorbs or adsorbs disruptive substances penetrating from outside, such as, e.g., oxygen or the water of atmospheric moisture, and as a result the first adhesive layer also has, in addition to its adhesive properties, oxygen- and/or moisture-repellent properties.

In the present case, the term "thin-layer encapsulation" defines an encapsulation which is suitable for forming a first barrier against atmospheric substances, in particular moisture and oxygen. The organic electronic device is pre-encapsulated by a thin film encapsulation. By reason of the thin-layer encapsulation, the organic electronic device already has a first basic sealing tightness with respect to environmental influences. In accordance with one embodiment of the invention, the thin-layer encapsulation only has "thin layers" with a thickness of less than or equal to several 100 nm.

The at least one thin-layer encapsulation is produced, e.g., by chemical vapour deposition (CVD), physical vapour deposition (PVD) and/or atomic layer deposition (ALD), such as, e.g., plasma-enhanced atomic layer deposition or plasma-less atomic layer deposition. In the present case, chemical vapour deposition (CVD) and atomic layer deposition (ALD) can define a method as described in German patent application 10 2008 031 405.

In the present case, physical vapor deposition can define a method in which a gaseous compound condenses on a surface of a provided substrate, such as, e.g., sputtering, an ion-enhanced deposition method or thermal evaporation.

Chemical vapor deposition can define a method, in which on at least one surface of a provided substrate having at least one organic functional layer, at least two gaseous starting compounds react to form a solid reaction product. The at least two gaseous starting compounds can be supplied at the same time to a volume, in which the substrate is provided. It may also be necessary for the at least one surface of the provided substrate having the at least one organic functional layer to be heated to a temperature above room temperature.

In the present case, ALD defines in particular a method in which a first gaseous starting compound is supplied to a volume, in which a surface to be coated is provided, so that the first gaseous compound can adsorb on the surface. After preferably complete or almost complete coverage of the surface with the first starting compound, the part of the first starting compound which is still in gaseous form and/or is not adsorbed on the surface is then generally removed from the volume and a second starting compound is supplied. The second starting compound is provided for the purpose of chemically reacting with the first starting compound adsorbed on the surface, thus forming a solid ALD-layer.

At this juncture, it may be pointed out that in the case of atomic layer deposition more than two starting compounds can also be used.

In the case of atomic layer deposition, it is generally advantageous if the surface to be coated is heated to a temperature above room temperature. As a result, the reaction can be initiated in a thermal manner to form the solid ALD-layer. In this case, the temperature of the surface to be coated is dependent in general upon the starting compounds.

In the present case, plasma-less atomic layer deposition (PLALD) defines an ALD method for which no plasma as described hereinafter is produced, but in which in order to form the solid layer the reaction of the starting compounds is initiated only by the temperature of the surface to be coated.

In the case of a PLALD method, the temperature of the surface to be coated is generally between 60° C. and 120° C. inclusive.

In the present case, plasma enhanced atomic layer deposition (PEALD) also defines an ALD method in which the second starting compound is supplied whilst a plasma is being generated at the same time, whereby the second starting compound is to be excited. Therefore—in comparison with a plasma-less ALD method—the temperature to which the surface to be coated must be heated can be reduced and by reason of the generation of plasma the reaction between the starting compounds can still be initiated. Preferably, in the case of PEALD the temperature of the surface to be coated is less than or equal to 120° C., particularly preferably less than or equal to 80° C.

In particular, a PEALD method can be advantageous if an initiation of the reaction between the starting compounds necessitates a surface temperature, at which the device to be encapsulated could be damaged.

In accordance with one embodiment, the getter material can be present in the adhesive layer in the form of getter particles. The getter particles can have a diameter of <1 μm to 50 μm. In particular, the diameter of the getter particles is not greater than the layer thickness of the adhesive layer so as not to damage the adjoining layers and the device. In particular, the getter particles have a diameter of at the most 20% of the layer thickness of the adhesive layer. For example, the getter particles have a maximum diameter of 10 μm with a thickness of the adhesive layer of 50 μm, a maximum diameter of 5 μm with a thickness of the adhesive layer of 25 μm and a maximum diameter of 2 μm with a thickness of the adhesive layer of 10 μm. A diameter of the getter particles of less than 1 μm is particularly preferred, irrespective of the layer thickness of the adhesive layer. Therefore, even when the particles are densely packed, punctiform forces on, e.g., an OLED can be reduced.

It is also possible for the getter material to be present in dissolved form in the adhesive.

In accordance with a further embodiment of the invention, the getter material can comprise oxidizable materials which can react with oxygen and water and bond these substances. In particular, metals from the group of alkali and alkaline earth metals are used as materials which can be oxidized easily. For example, the getter material can comprise magnesium, calcium, barium, caesium, cobalt, yttrium, lanthanum and/or metals of the rare earths. Furthermore, other metals, such as, e.g., aluminum, zirconium, tantalum and/or titanium or oxidizable non-metallic materials can also be suitable. Moreover, the getter material can also comprise CaO, BaO and MgO.

In a further embodiment, the getter material comprises drying agents which can irreversibly absorb water without changing their volume.

Also possible are drying agents which can bond water by physisorption without thereby substantially changing their volume. By virtue of increased temperature, the adsorbed water molecules can be removed again. The getter material can comprise, e.g., dried silica gels.

In a particularly preferred manner, the getter material comprises zeolites which are preferably dried and which can adsorb oxygen and/or water in their pores and channels. Adsorption of water and/or oxygen by dried silica gels and/or zeolites does not produce any products which are detrimental for the underlying layers and the dried silica gels and/or zeolites preferably do not change their volume by virtue of the reaction with water and/or oxygen.

In one embodiment, the encapsulation is formed to be transparent. In the present case, the term "transparent" is understood to mean that a material or a layer is permeable to the entire visible electromagnetic spectrum or a partial spectrum thereof. In particular, the encapsulation can be transparent for radiation which is either emitted or received by an active layer of the device which is protected against environmental influences by the encapsulation. The light emitted by, e.g., an OLED can thus be coupled out via the encapsulation and the OLED is designed as a "top emitter". It is also possible for light to be irradiated into the organic electronic device from outside via the encapsulation, such as, e.g., in the case of an organic solar cell. In this embodiment, the encapsulation, comprising the thin-layer encapsulation, the first adhesive layer and the covering layer, is arranged in the beam path, e.g., of the emitted light of an OLED or in the beam path of the coupled-in light of a solar cell.

In a further embodiment, the encapsulation comprises at least one second thin-layer encapsulation. The material of the second thin-layer encapsulation can be different from that of the first thin-layer encapsulation. In this manner, it is possible to adapt the optical properties of the first and second thin-layer encapsulation such that their transmission for visible light is increased.

The second thin-layer encapsulation can be produced like the first thin-layer encapsulation, e.g., by CVD, PVD and/or ALD.

The first and/or second thin-layer encapsulation can comprise one of the following materials: aluminum oxide, zinc oxide, zirconium oxide, titanium oxide, hafnium oxide, lanthanum oxide, silicon oxide, silicon nitride.

The first and/or second thin-layer encapsulation can have a layer thickness of 1 nm to 5 μm. In particular, the layer thickness of the first and/or the second thin-layer encapsulation can be between 10 nm and 500 nm and particularly preferably the layer thickness is between 10 nm and 100 nm. Thin layer thicknesses of the thin-layer encapsulation generally contribute to high optical transmission of the thin-layer encapsulation. The layer thicknesses of the first and the second thin-layer encapsulation can be different.

The first adhesive layer has, e.g., a layer thickness of 10 μm to 100 μm. In particular, the first adhesive layer can have a layer thickness of 10 μm to 50 μm. Thin layer thicknesses of the first adhesive layer generally contribute to high optical transmission of the layer. Furthermore, the first adhesive layer can comprise an adhesive material, in which the getter material is incorporated. In particular, the adhesive layer can also be transparent for the radiation emitted or received by the device.

Furthermore, the getter material, when present in the form of getter particles in the adhesive layer, can have a scattering effect upon radiation. The scattering effect can be caused by a difference in refractive index between the refractive index of the first adhesive layer, e.g., the adhesive material, and the refractive index of the getter particles. A scattering effect occurs if the getter particles have a different refractive index with respect to the first adhesive layer, e.g., the adhesive material. In particular, an advantageous scattering effect is achieved if the difference in the refractive indices is greater than or equal to 0.05 in regions of the visible spectral range. The scattering effect can be optimised or controlled by the size of the particles, their distribution and their concentration. For a scattering effect, the getter particles have an average particle size of 10 nm to 10 μm, in particular an average particle size of 100 nm to 3 μm. The getter particles can also have no scattering effect upon radiation. This is the case if the getter particles and the first adhesive layer have an identical refractive index.

Furthermore, the first adhesive layer can have scatter particles in addition to the getter material and the adhesive material. In particular, the first adhesive layer can comprise scatter particles if the getter material or the getter particles do not have a scattering effect upon the emitted radiation, e.g., of an OLED. The scatter particles can comprise air bubbles, metal oxides, CaF, diamond and/or glass. The metal oxides can comprise $ZrO_2$, $TiO_2$, $Al_2O_3$, $SiO_2$, ZnO, indium tin oxide (ITO), indium zinc oxide (IZO) and $Ga_2O$. The scatter particles can be coated or uncoated. The scatter particles have an average particle size of 10 nm to 10 μm, in particular an average particle size of 100 nm to 3 μm. It is possible for the scatter particles to differ in terms of their particle size. It is also possible for different scatter particles to be present in the first adhesive layer. If the optical electronic device is an OLED, the homogeneity of the illumination level at the light exit surface can be improved by a scattering effect of the getter particles and/or the scatter particles. A more homogeneous directional characteristic of the OLED can be achieved. In particular, if the first adhesive layer protrudes beyond the edges of the active layer of the OLED, the getter and/or scatter particles may achieve the effect that the OLED has a larger effective emission surface or can illuminate a larger surface compared with a device without particles having a scattering effect. The encapsulation can thus be used not only for adhesion of the thin-layer encapsulation and the covering layer and for retarded air or oxygen diffusion and for retarded moisture diffusion but also to improve the coupling-out of wave-guided light modes, if the organic electronic device is, e.g., an OLED.

In one embodiment, the getter material of the first adhesive layer is distributed homogeneously in the first adhesive layer, e.g., in the adhesive material. In particular, a homogeneous distribution of the getter material facilitates the application of the first adhesive layer. A homogeneous distribution of the getter material permits uniform oxygen- and/or water-absorption via the entire adhesive layer. If the getter material is present in the form of particles in the adhesive layer and should these particles have a scattering effect upon emitted radiation from, e.g., an OLED, a homogeneous scattering of the radiation is additionally achieved by a homogeneous distribution of the getter particles.

Furthermore, the first adhesive layer can additionally comprise heat-conducting particles. In particular, the heat-conducting particles are selected from a group comprising carbon nanotubes, diamond, copper, boron nitride, aluminum, aluminum nitride and/or aluminum oxide. The thermal conductivity can be between 28 W/mK and 6000 W/mK. If the encapsulation forms part of an organic electronic device, heat is generated in the device during operation. Resulting thermal gradients produce premature ageing of the device and, e.g., in the case of an organic light-emitting diode, light which is coupled-out differently. The addition of heat-conducting particles serves to dissipate heat or to distribute heat more uniformly within the device and thus reduces differential ageing of the device and thus increases the service life of the device, or increases the light density in the case of, e.g., an organic light-emitting diode. The higher the thermal conductivity the better the heat can be dissipated or distributed more uniformly in the device. It is also possible for the heat-conducting particles of a corresponding size and/or having a refractive index difference with respect to the adhesive material to additionally have a scattering effect upon radiation, e.g., of an OLED.

In a further embodiment, the getter material is distributed non-homogeneously in the first adhesive layer, e.g., in the adhesive material. In particular, the getter material can have a higher concentration at the edges of the first adhesive layer. This embodiment is particularly suitable if oxygen and/or water penetrating to an increased extent from the side is to be absorbed. This is possible, e.g., if the first adhesive layer is in direct contact with the surrounding area at the side edges, whereas the main surface of the first adhesive layer is covered by the covering layer.

In one embodiment, the adhesive material of the first adhesive layer comprises a two-component adhesive and/or a thermally hardening adhesive. In one embodiment, the adhesive material comprises methyl acrylate adhesives. Methyl acrylate adhesives polymerize in accordance with a radical mechanism, wherein methyl acrylate is used as a monomer.

In a particularly preferred manner, the adhesive material of the first adhesive layer can comprise a light-hardening adhesive. Light-hardening adhesives permit targeted hardening under UV light and rapid hardening. The light-hardening adhesives are used preferably without solvents. Therefore, possible undesired effects caused by shrinkage of the adhesive layer as a result of solvent shrinkage, such as layer stresses and point forces on the underlying layer, can be avoided. Therefore, there is also no risk of a solvent penetrating into the active layer, e.g., of an OLED and thus possibly damaging the active layer. Since solvents must then be removed by suction during hardening, the technical outlay is considerably reduced when solvent-free adhesives are used.

In one embodiment, the adhesive material of the first adhesive layer comprises an epoxide resin adhesive. Epoxide resin adhesives do not damage the organic electronic device in the case of a point defect. The epoxide resin adhesive comprises an epoxide-containing A-component and a B-component as hardener. The A-component comprises at least one epoxide resin which is selected from cycloaliphatic and aliphatic epoxide resins. Preferably, the A-component is solvent-free.

In accordance with a further embodiment, the adhesive material of the first adhesive layer can also comprise silicone hybrids, polyurethanes, acrylates, phenolic resins, polysulphides and/or melamine resins.

The covering layer of the encapsulation serves for mechanical strength and resistance of the encapsulation and protects the organic electronic device against mechanical influences. The covering layer can be selected from a group comprising glass, metals, lacquers or synthetic materials. The metals can comprise, e.g., copper or aluminum. The metals and synthetic materials can be foils/films.

The covering layer can have a layer thickness of 10 μm to 4 mm. A layer thickness of the covering layer of 100 μm to 0.7 mm is particularly preferred.

A further embodiment of the invention provides an organic electronic device comprising a substrate, at least one active layer arranged on the substrate, and an encapsulation, as already described. Furthermore, the encapsulation is arranged above the active layer.

In accordance with one embodiment, the active layer is a radiation-producing layer such as, e.g., in the case of an OLED, or is a radiation-receiving layer such as, e.g., in the case of an organic solar cell.

The active layer of an OLED or the plurality thereof can comprise organic polymers, organic oligomers, organic monomers, organic small, non-polymeric molecules ("small molecules") or combinations thereof. Furthermore, the active layer can also be designed as an electroluminescent layer. Suitable materials for this include materials which have radiation emission by reason of fluorescence or phosphorescence, e.g., polyfluorene, polythiophene or polyphenylene or derivatives, compounds, mixtures or copolymers thereof.

If the device is an organic solar cell, the active layer or the plurality thereof can comprise one or a plurality of semi-conducting materials which are monomeric, oligomeric and/or polymeric.

The organic electronic device comprises a first electrode and a second electrode which are used for injection of the charge carriers into the active layer or discharge p-holes (positive charges), formed by light irradiation, and electrons.

In particular, the first electrode and/or the second electrode can be formed to be transparent. The first electrode or second electrode can each be switched as an anode or as a cathode. Generated light, e.g., of an OLED can thus be radiated via the anode and/or the cathode or light can pass from outside via the anode and/or cathode into the device, as in the case of, e.g., an organic solar cell.

A transparent first electrode which can be designed as an anode and thus serves as p-hole-injecting material can comprise or consist of, e.g., a transparent conductive oxide. Transparent conductive oxides ("TCOs" for short) are transparent, conductive materials, generally metal oxides, such as, e.g., zinc oxide, tin oxide, cadmium oxide, titanium oxide, indium oxide or indium tin oxide (ITO). In addition to binary metal oxygen compounds, such as, e.g., ZnO, $SnO_2$ or $In_2O_3$, tertiary metal oxygen compounds, such as, e.g., $Zn_2SnO_4$, $CdSnO_3$, $ZnSnO_3$, $MgIn_2O_4$, $GaInO_3$, $Zn_2In_2O_5$ or $In_4Sn_3O_{12}$ or mixtures of different transparent conductive oxides also belong to the group of TCOs. Furthermore, the TCOs do not compulsorily correspond to a stoichiometric composition and can also be p-doped or n-doped.

The second electrode can be designed as a cathode and can thus be used as electron-injecting material. In particular, inter alia aluminum, barium, indium, silver, gold, magnesium, calcium, copper, yttrium, ytterbium, samarium or lithium and compounds, combinations and alloys thereof can prove to be advantageous as cathode materials.

In one embodiment, the substrate is transparent. Therefore, generated light from, e.g., an OLED can be radiated through the substrate or light can also be coupled from outside through the substrate into the device, as in the case of, e.g., an organic solar cell, even if the electrode adjacent to the substrate is transparent. In the case of an OLED, it can be designed as a so-called "bottom emitter". It can also be a "transparent OLED", if in addition the encapsulation is transparent and light is thus emitted both downwards through a transparent substrate and upwards through a transparent encapsulation. For example, the substrate can comprise glass, quartz, synthetic material films, metal, metal foils, silicon wafers or another suitable substrate material. In particular, the substrate can be a synthetic material film which comprises suitable barrier layers.

In one embodiment, the layer of the organic electronic device directly adjoining the encapsulation does not have a cavity, i.e., hollow spaces with respect to the encapsulation. There is direct contact between the thin-layer encapsulation and the organic electronic device. In particular, there is direct contact between the encapsulation and the active layer. It is also possible that the encapsulation does not have a cavity. There is direct contact between the thin-layer encapsulation and the at least one first adhesive layer and the at least one first adhesive layer and the covering layer. In this manner, it is possible to achieve a particular sealing tightness of the encapsulation and thus increased protection of the organic electronic device.

In a further embodiment, the active layer of the organic electronic device has edges and lateral surfaces and a main surface facing away from the substrate, wherein the at least one thin-layer encapsulation covers at least the edges and/or the lateral surfaces and the main surface of the active layer facing away from the substrate. In particular, the edges and/or lateral surfaces and the main surface of the active layer facing away from the substrate can be covered completely by the thin-layer encapsulation. Therefore, the thin-layer encapsulation can ensure initial shielding of the main surface, facing away from the substrate, and the edges and/or lateral surfaces of the active layer with respect to oxygen and water of the surrounding area.

In a further embodiment, also a part of the main surface of the substrate which is not covered by the active layer is covered by the at least one thin-layer encapsulation, in particular the part of the substrate which is adjacent to the active layer, in order to ensure effective encapsulation.

In a further embodiment, the at least one thin-layer encapsulation has a main surface facing away from the active layer, wherein the first adhesive layer is arranged above the main surface—facing away from the active layer—of the at least one thin-layer encapsulation.

In particular, the sub-regions of the thin-layer encapsulation can also be covered by the first adhesive layer which cover the edges and/or the lateral surfaces of the active layer of the organic electronic device. In this embodiment, the first adhesive layer extends beyond the edges of the active layer which are covered by the thin-layer encapsulation. Since oxygen and water from the surrounding area penetrate in particular via the edges and lateral surfaces to the active layer, the exclusion of air and moisture should be particularly high in this case, which is achieved in accordance with this embodiment. The first adhesive layer can extend between 10 μm and 20 mm, in particular between 0.5 mm and 5 mm and particularly preferably between 0.5 mm and 3 mm beyond the edges of the active layer which are covered by the thin-layer encapsulation. The further the first adhesive layer extends beyond the edges of the active layer covered by the thin-layer encapsulation, the better the edges and lateral surfaces of the active layer are shielded from the ingress of oxygen and water.

It is possible for the first adhesive layer to be in direct contact with the substrate. As a result, the adhesion is substantially improved.

It is also possible for the first adhesive layer to have different layer thicknesses above the sub-regions of the thin-layer encapsulation, which cover the edges and/or the lateral surfaces of the active layer, and above the main surface of the thin-layer encapsulation. In particular, the layer thickness of the first adhesive layer which covers the sub-regions of the thin-layer encapsulation which cover the edges and/or the lateral surfaces of the active layer can be thicker than the layer thickness of the first adhesive layer above the main surface of the thin-layer encapsulation. In this manner, the edges and/or lateral surfaces of the active layer can be protected more efficiently against ingress of oxygen and water. This is possible, e.g., if the covering layer has a low permeability for oxygen and water and therefore the main surface of the active layer is already adequately protected against external influences by the thin-film encapsulation, a thin first adhesive layer and the covering layer.

In a further embodiment, the first adhesive layer covers regions of the thin-film encapsulation which extend beyond the active layer over the substrate, which results in a particularly effective encapsulation and thus protection of the active layer of the organic electronic device.

In particular, the first adhesive layer can be in direct contact with the surrounding area. Against expectation, the inventors have established that the adhesive layer having at least one getter material ensures an extremely high level of absorption and/or adsorption of oxygen and water and thus ensures considerable retardation of the oxygen and water diffusion with respect to the active layer of an organic electronic device, even if there is direct contact of the adhesive layer having at least one getter material with the surrounding area.

In a further embodiment, the covering layer which protects the organic device from mechanical influences is arranged above the main surface—facing away from the active layer—of the at least one thin-layer encapsulation. The covering layer can protrude beyond the lateral surfaces and edges of the active layer. In particular, the entire main surface of the covering layer facing towards the first adhesive layer can be adhered to the first adhesive layer. It is also possible for the covering layer to be arranged above the lateral surfaces of the first adhesive layer. It is thus possible to achieve particularly effective protection of the lateral surfaces of the active layer which is thus covered by the thin-layer encapsulation, the first adhesive layer and the covering layer.

In a further embodiment, an organic electronic device is provided, wherein a second adhesive layer is provided and wherein the second adhesive layer is arranged circumferentially at least partially around the first adhesive layer. The second adhesive layer serves to promote adhesion of the covering layer and the thin-layer encapsulation. In this manner, premature delamination of these layers is more effectively prevented.

Preferably, the second adhesive layer thus exhibits a better adhesive property than the first adhesive layer. In particular, the second adhesive layer can be free of getter material, in order to achieve increased adhesive strength. The adhesive strength can be between 1 N/mm and 20 N/mm, in particular between 3 N/mm to 10 N/mm.

In a further embodiment, the second adhesive layer has a shearing strength between 1 $N/mm^2$ and 90 $N/mm^2$, in particular between 5 $N/mm^2$ and 15 $N/mm^2$. The shearing strength is the resistance which the covering layer offers against tangential shearing forces. It indicates the maximum shearing stress, to which the covering layer can be loaded prior to shearing off.

The second adhesive layer can comprise an epoxide resin adhesive. In a particularly advantageous manner, epoxide resin adhesives are used which are hardened at temperatures of 80° C. to about 100° C. It is also possible for the epoxide resin adhesives to be hardened by exposure to UV light. Preferably, the second adhesive layer can comprise the same adhesive material as the first adhesive layer.

The second adhesive layer can be formed to be transparent. Therefore, the encapsulation which comprises a second adhesive layer can also be formed to be transparent on the whole.

In a further preferred embodiment, the second adhesive layer is arranged completely circumferentially around the first adhesive layer which results in even better adhesion of the adjoining layers.

The sub-regions of the thin-layer encapsulation can be covered by the second adhesive layer which cover the edges and/or the lateral surfaces of the active layer of the organic electronic device. In this embodiment, the second adhesive layer extends beyond the edges of the active layer which are covered by the thin-layer encapsulation. The second adhesive layer can extend between 50 µm and 20 mm, in particular between 500 µm and 5 mm and particularly preferably between 500 µm and 3 mm beyond the edges of the active layer which are covered by the thin-layer encapsulation.

In a further embodiment of the organic electronic device, the second adhesive layer is arranged above the main surface of the thin-layer encapsulation facing away from the active layer and the first adhesive layer is arranged circumferentially at least partially around the second adhesive layer. In this embodiment, the adhesive strength between the covering layer and the thin-layer encapsulation is particularly high by reason of the second adhesive layer and premature delamination of the layers is more effectively prevented.

In particular, the first adhesive layer can be arranged completely circumferentially around the second adhesive layer. In this embodiment, in addition to the high adhesive strength of the layers adjoining the second adhesive layer, the active layer and the thin-layer encapsulation are protected by the first adhesive layer against air and water diffusion from the sides.

This protection is increased still further in a further embodiment, in which the first adhesive layer also covers the sub-regions of the thin-layer encapsulation which cover the edges and/or the lateral surfaces of the active layer.

In a further embodiment of the organic electronic device, the active layer is arranged between a first electrode and a second electrode, wherein the first electrode is arranged on the substrate. The electronic device comprises a first further adhesive layer which comprises at least one getter material.

The first further adhesive layer can be arranged between the first electrode and the substrate. In the case of this embodiment, the organic electronic device can be protected against the ingress of moisture and air by the encapsulation and in addition from the substrate by the first further adhesive layer. In particular, this embodiment is possible in the case of flexible OLEDs which have substrates formed in a flexible manner. Flexible substrates, e.g., consisting of synthetic material films have an increased permeability for moisture and oxygen compared with, e.g., glass substrates. Therefore, there is an increased requirement, particularly in these cases when the substrate does not afford adequate protection, to protect the active layer of an OLED, also from the substrate, in a more effective manner against the penetration of water and air.

In accordance with a further embodiment, the first further adhesive layer is arranged on coarse substrates. Coarse substrates have, e.g., different surface heights, irregularities or a non-uniform surface. The surface heights can be in the range of 10 nm and 100 µm. The first further adhesive layer can also act in this case in a planarizing manner and at least substantially eliminate possible surface heights or irregularities of the substrate. In particular, this embodiment can be a top emitter OLED.

The first further adhesive layer which comprises a getter material can have the same features or combinations of features, as described above for the first adhesive layer.

In a further embodiment, at least one thin-layer encapsulation is arranged between the first further adhesive layer and the first electrode.

In a further embodiment, a second further adhesive layer is provided in the device and is arranged circumferentially around the first further adhesive layer. The second further adhesive layer can be free of getter materials in order to achieve increased adhesive strength. The second further adhesive layer can have the same features or combinations of features which are described above for the second adhesive layer. Preferably, the second further adhesive layer is arranged completely circumferentially around the first further adhesive layer.

In a further embodiment, the second further adhesive layer is arranged between the first electrode and the substrate and the first further adhesive layer is arranged circumferentially around the second further adhesive layer. Preferably, the first further adhesive layer is arranged completely circumferentially around the second further adhesive layer.

The organic electronic device can be an organic light-emitting diode, a solar cell, an organic field effect transistor (OFET) and/or organic electronics. The organic field effect transistor can be an all-OFET, in which all layers are organic.

In one embodiment, the organic electronic device is a plane device, wherein the active layer of the organic electronic device can have a surface area of 1 $cm^2$ to 1 $m^2$. In particular, the active layer can have a surface area of 5 $cm^2$ to 2000 $cm^2$ and particularly preferably a surface area of 25 $cm^2$ to 1000 $cm^2$. In a particularly preferred manner, the plane device is a surface light source.

An OLED can comprise further layers in the form of: a p-hole-inducing layer, a p-hole-transporting layer, an electron-transporting layer and/or an electron-inducing layer. Such layers can be used to increase the efficiency of the OLED further and can be formed at one or a plurality of suitable places of the OLED. Possible materials of these layers are described, e.g., in EP 1770 799 A2, WO 2010/122113 A1 or WO 2010/048920 A1.

In accordance with the invention, a method for producing an organic electronic device is provided, comprising the method steps of:
 a) providing an organic electronic layer stack comprising a first and a second electrode, a substrate and at least one active layer,
 b) depositing at least one thin-layer encapsulation on the layer stack,
 c) applying a first adhesive layer,
 d) arranging a covering layer above the first adhesive layer.

By applying the first adhesive layer, the covering layer can be adhered to the thin-layer encapsulation.

Method step b) can comprise a further method step b1) of depositing at least one second thin-layer encapsulation.

The provision of the organic electronic layer stack under method step a) can comprise the following method steps of:
 a1) providing the substrate,
 a2) applying a first further adhesive layer onto the substrate,
 a3) arranging the first electrode on the first further adhesive layer,
 a4) applying the active layer on the first electrode,
 a5) arranging the second electrode on the active layer.

The provision of an organic electronic layer stack under method step a) can comprise, after method step a2), a further method step a2') of depositing at least one thin-layer encapsulation on the first further adhesive layer.

It is possible for method step a2) to comprise a further method step a2") of applying a second further adhesive layer.

In particular, the thin-layer encapsulations can be deposited under method step b) and/or b1) and/or a2') by CVD, ALD and/or PVD.

In particular, the covering layer can be laminated on under method step d). If the covering layer is laminated on, a particularly thin covering layer can be applied. The covering layer can have a layer thickness of 100 μm to 0.7 mm. This method is suitable primarily for glass, synthetic material and metal foils.

A further method step e) of UV-hardening the first adhesive layer is possible after method step d).

Two further method steps e1) of UV-pre-hardening the first adhesive layer and e2) of thermal post-hardening the first adhesive layer are possible after method step d). By reason of the pre-hardening, it is possible to achieve pre-fixing of the covering layer above the thin-layer encapsulation within a short period of time, which means that the thin-layer encapsulation can no longer change its position. Subsequently, complete hardening can be effected thermally over a longer period of time. The pre-hardening can be achieved, e.g., by exposure to light (250 nm<λ<400 nm) in an intensity range of 100 mW/$cm^2$ for three minutes. Thermal post-hardening can be effected at 80° C. for 30 minutes.

The first further adhesive layer can be hardened in an analogous manner to the methods described for the first adhesive layer after method step a2') or a3).

It is possible for method step c) to comprise a further method step c1) of applying the second adhesive layer.

A further method step f) of hardening the second adhesive layer can also be possible after method step d), e) or e2).

In particular, method step f) can comprise thermally hardening the second adhesive layer at temperatures of 80° C. to 100° C.

It is also possible for method step f) to comprise hardening the second adhesive layer by exposure to UV-light.

The second further adhesive layer can be hardened in an analogous manner to the methods described for the second adhesive layer after method step a2') or a3).

BRIEF DESCRIPTION OF THE DRAWINGS

Further advantageous embodiments and developments of the invention are apparent from the exemplified embodiments described hereinafter in conjunction with the figures.

Figure 1A:
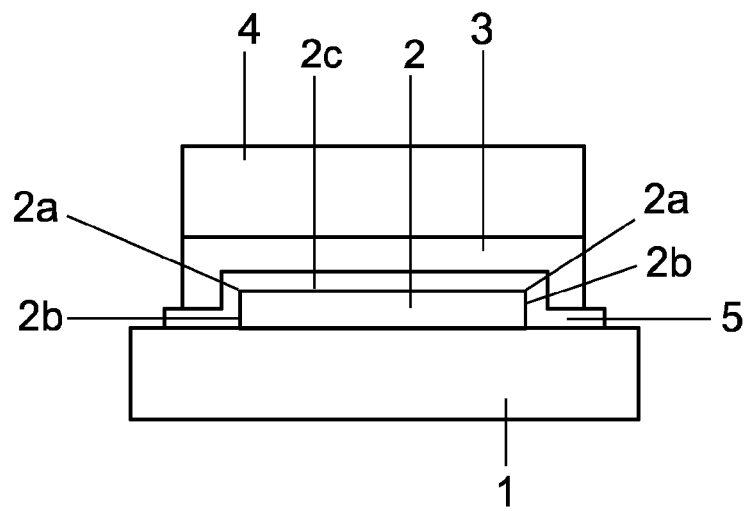
FIGS. 1A and 1B show an exemplified embodiment of an organic electronic device in a schematic sectional illustration and in a top view.

In the exemplified embodiments and figures, like parts, or parts acting in an identical manner, are provided with the same reference numerals in each case. The illustrated elements and the size ratios of the elements with respect to each other are not to be regarded as being to scale. Rather, individual elements, in particular layer thicknesses, may be illustrated excessively large for ease of understanding.

DETAILED DESCRIPTION OF ILLUSTRATIVE EMBODIMENTS

The organic electronic device in accordance with the exemplified embodiment of FIG. 1A comprises a substrate 1, an active layer 2 arranged on the substrate 1, a thin-layer encapsulation 5 arranged on the active layer 2, an adhesive layer having a getter material 3, and a covering layer 4. The getter material is present in the adhesive layer 3 e.g. in the form of getter particles. In particular, the thin-layer encapsulation 5 and the adhesive layer 3 and the adhesive layer 3 and the covering layer 4 are in direct contact with one another. The thin-layer encapsulation 5 covers the edges 2a, the lateral surfaces 2b and the main surface 2c of the active layer 2 and partially covers the main surface of the substrate 1 which is adjacent to the active layer 2 and is not covered by the active layer 2. It is also possible for the thin-layer encapsulation 5 to completely cover the main surface of the substrate 1 which is adjacent to the active layer 2 and is not covered by the active layer 2. The adhesive layer 3 covers the main surface of the thin-layer encapsulation 5 and the sub-regions of the thin-film encapsulation 5 which cover the edges 2a and the lateral surfaces 2b of the active layer 2. The adhesive layer 3 extends beyond the edges 2a of the active layer 2 which are covered by the thin-layer encapsulation 5 and is in direct contact with the surrounding area. The covering layer 4 covers the main surface of the adhesive layer 3. By arranging the adhesive layer 3 above the edges 2a and the lateral surfaces 2b of the active layer 2 which are covered by the thin-layer encapsulation 5, an overlap region of the adhesive layer 3 beyond the edges 2a of the active layer 2 is produced. By means of this arrangement, moisture penetrates via the lateral surfaces 2b into the active layer 2 after a much longer period of time than in the case of other organic electronic components, since the lateral surfaces 2b of the active layer 2 are covered with the thin-layer encapsulation 5 and the adhesive layer 3. The advantage is enormous particularly in the case of large-surface devices, since the path from the outer edges to the active layer 2 is correspondingly longer for moisture and/or oxygen. In the case of the embodiment, the getter material can comprise, e.g., zeolites, but oxidizable and/or hydrophilic materials are also possible. The thin-layer encapsulation 5 can comprise, for example, aluminum oxide, but also zinc oxide, zirconium oxide, titanium oxide, hafnium oxide, lanthanum oxide, silicon oxide, silicon nitride. The covering layer 4 can comprise glass, but aluminum, copper, a lacquer or a synthetic material are also possible. The thin-layer encapsulation 5, the adhesive layer 3 and the covering layer 4 can be formed to be transparent. Preferably, the organic electronic device is an OLED, wherein the radiation is coupled out either via a transparent substrate 1 and/or via the transparent encapsulation. Depending on their size, the getter particles can have a scattering effect in relation to the generated radiation of the active layer 2. The encapsulation can thus in addition to the adhesion of the thin-layer encapsulation 5 and the covering layer 4 and in addition to retarded air and moisture diffusion, be used to improve the coupling-out of the radiation. The active layer 2 of the device comprises, e.g., an organic functional material. Electromagnetic radiation with an individual wavelength or a range of wavelengths can be generated in the active layer 2 of an OLED by electron and p-hole injection and recombination. This can appear to the viewer as a single-colored, a multi-colored and/or a mixed-colored light. The organic functional material can have, e.g., organic polymers, organic oligomers, organic monomers, organic small, non-polymeric molecules or combinations thereof. The first substrate can comprise quartz, synthetic material films, metal, metal foils, silicon wafers or any other suitable substrate material. It is also possible for the exemplified embodiment in accordance with FIG. 1A to be an organic solar cell, an organic field effect transistor or organic electronics. If the device is an organic solar cell, the active layer 2 can receive radiation and can comprise one or plurality of semiconducting materials which are monomeric, oligomeric and/or polymeric.

Figure 1B:
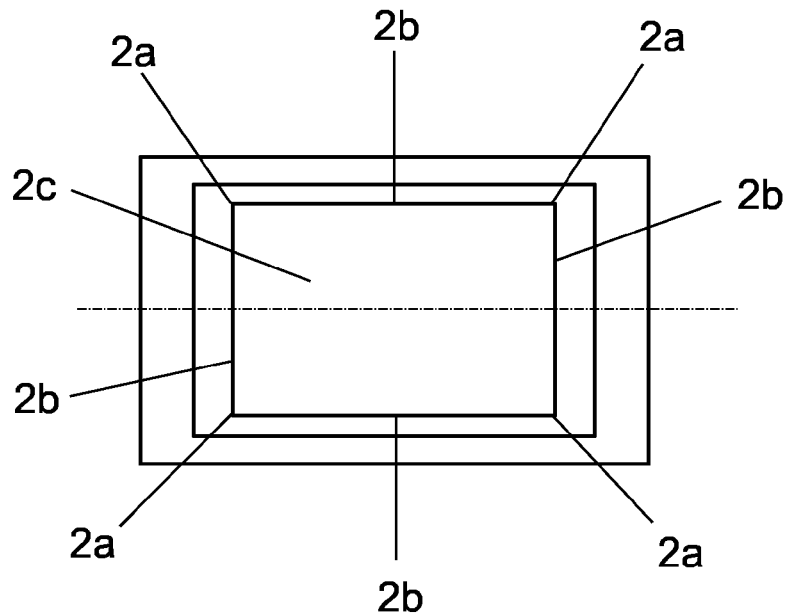

FIG. 1B shows a top view of the device already shown in FIG. 1A. FIG. 1B shows that the active layer 2 is applied centrally above a part of the main surface of the substrate 1. The adhesive layer 3 is arranged above the active layer 2, covers the main surface 2c of the active layer 2 and protrudes beyond the edges 2a of the active layer 2. A cross-section along the dotted line produces the schematic sectional illustration of the device in accordance with FIG. 1A.

The service life of bottom emitter OLEDs with an area of 40 cm$^2$ and 1.67 cm$^2$ was tested as a function of the operating period of the OLEDs at 60° C. and 90% relative humidity (rH). The term "relative humidity" is to be understood to refer to the percentage ratio between the vapor pressure of the water and the saturation vapor pressure thereof. Bottom emitter OLEDs having a thin-layer encapsulation, a pure epoxide adhesive without any getter material and applied glass have a failure rate of 40% after ca. 1700 h on account of the formation of "dark spots" which are produced by the penetration of air and water into the active layer. In the case of the inventive bottom emitter OLEDs which differ from the aforementioned OLEDs only by reason of a getter material in the epoxide adhesive, the failure rate is 20% after ca. 1700 h and is therefore half less than in the case of the OLEDs without any getter material in the epoxide adhesive. The reason that the inventive OLEDs fail is not because water and/or oxygen penetrate(s) into the active layer but because inadequate adhesion of the first adhesive layer having getter material causes premature delamination. This premature delamination can be reduced by the application of the second adhesive layer.

Figure 2:
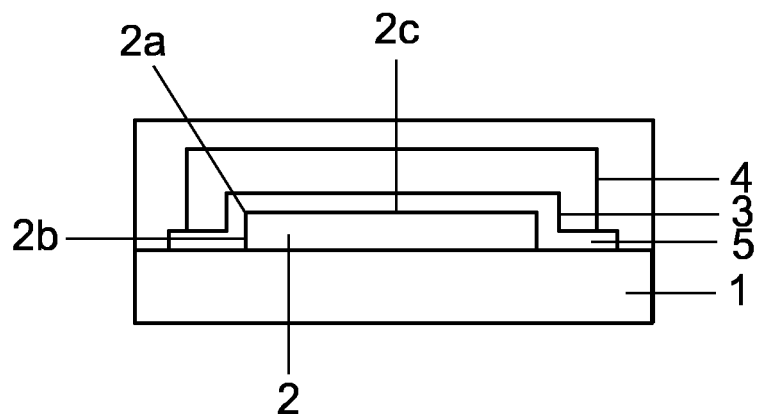
FIGS. 2 to 5 show schematic sectional illustrations in each case of an organic electronic device according to different exemplified embodiments.

In contrast to the exemplified embodiment in accordance with FIG. 1A, the exemplified embodiment in accordance with FIG. 2 shows that the covering layer 4 is arranged in addition above the lateral surfaces of the thin-layer encapsulation 5 and the lateral surfaces of the adhesive layer 3. If the covering layer 4 comprises glass, the covering layer 4 can be adhered to the substrate 1 by glass frits. The adhesive layer 3 is not in direct contact with the surrounding area and is shielded from air and moisture of the surrounding area by the covering layer 4. This arrangement serves to retard air and moisture diffusion through the lateral surfaces 2b of the active layer 2. The shielding of the active layer 2 at the lateral surfaces 2b is further improved in comparison with the exemplified embodiment in accordance with FIG. 1a, since at least two protective layers (thin-layer encapsulation 5, adhesive layer 3 and covering layer 4 or thin-layer encapsulation 5 and covering layer 4) are applied above the lateral surfaces 2b.

Figure 3:
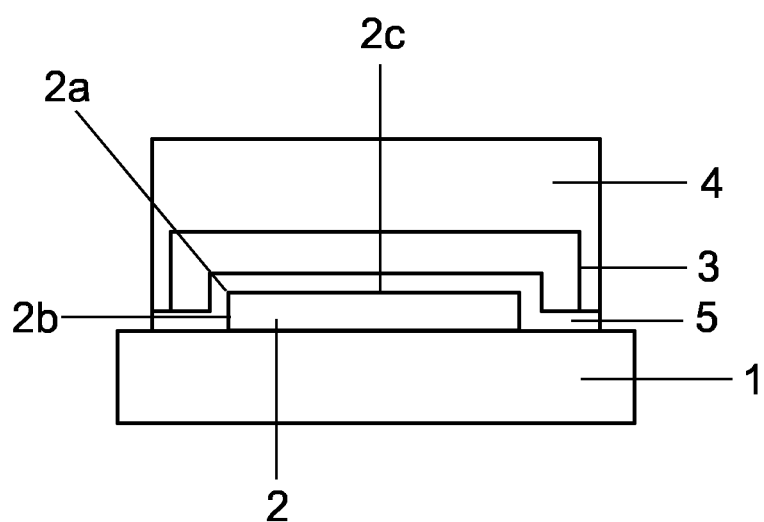

In contrast to the exemplified embodiment in accordance with FIG. 1A, the exemplified embodiment in accordance with FIG. 3 shows that the covering layer 4 is arranged in addition above the lateral surfaces of the adhesive layer 3. The adhesive layer 3 is not in direct contact with the surrounding area and is shielded from air and moisture by the covering layer. Since in the case of this embodiment the main surface and the lateral surfaces of the adhesive layer 3 are covered by the covering layer 4, moisture and air diffusion into the active layer 2 via these surfaces are particularly effectively retarded.

Figure 4:
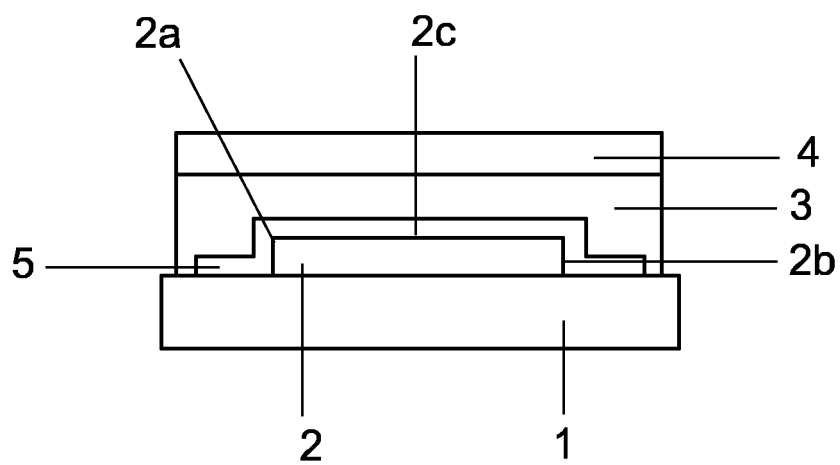

FIG. 4 shows a further exemplified embodiment, wherein in contrast to the exemplified embodiment in accordance with FIG. 1A the adhesive layer 3 still partially covers the main surface of the substrate 1 adjacent to the active layer 2. In this manner, the lateral surfaces 2b of the active layer 2 are completely encapsulated with the thin-layer encapsulation 5 and the adhesive layer 3, which results in extensive protection also of the lateral surfaces 2b of the active layer 2 against environmental influences.

Figure 5:
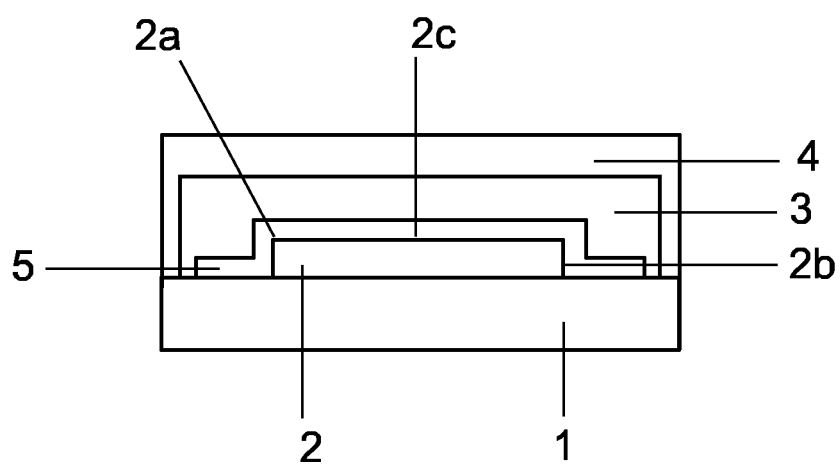

In contrast to the exemplified embodiment in accordance with FIG. 4, the exemplified embodiment in FIG. 5 shows that the covering layer 4 is also arranged above the lateral surfaces of the adhesive layer 3. If the covering layer 4 comprises glass, the covering layer 4 is adhered to the substrate 1 by glass frits. In this embodiment, the active layer 2 on the main surface 2c and the lateral surfaces 2b is covered by the thin-layer encapsulation 5, the adhesive layer 3 and the covering layer 4, which is characterized by particularly hermetic protection of the active layer 2.

Figure 6A:
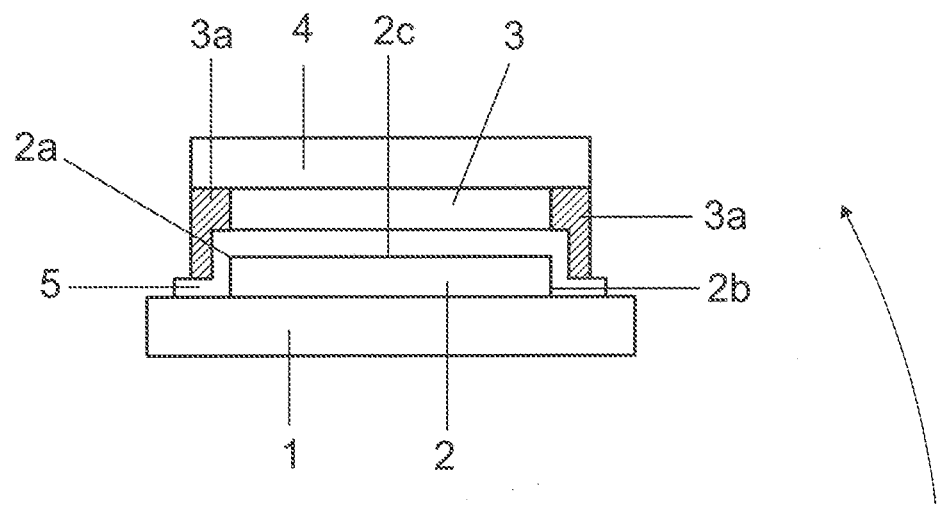
FIGS. 6A and 6B show a further exemplified embodiment of an organic electronic device in a schematic sectional illustration and in a top view.

All of the exemplified embodiments shown in FIGS. 1A, 1B and 2 to 5 are also possible with a first adhesive layer 3 and a second adhesive layer 3a. FIG. 6A shows a variant of the embodiment in accordance with FIG. 1A having a second adhesive layer 3a. In this embodiment, the adhesive layer 3 covers the main surface 2c of the active layer 2 and the second adhesive layer 3a is arranged completely circumferentially around the first adhesive layer 3 and covers the sub-regions of the thin-layer encapsulation 5 which cover the edges 2a and the lateral surfaces 2b of the active layer 2. The adhesive layer 3 extends beyond the edges 2a of the active layer 2 which are covered by the thin-layer encapsulation 5 and is in direct contact with the surrounding area. The covering layer 4 covers the main surface of the adhesive layers 3 and 3a. The thin-layer encapsulation 5, the adhesive layers 3 and 3a and the covering layer 4 can be formed to be transparent. The second adhesive layer 3a can comprise an epoxide resin and has a better adhesive property than the first adhesive layer 3 and in particular can be free of getter material. This arrangement of the second adhesive layer 3a results in better adhesion of the covering layer 4 and the thin-layer encapsulation 5. The shearing strength of the second adhesive layer is between 1 N/mm$^2$ and 90 N/mm$^2$, in particular between 5 N/mm$^2$ and 15 N/mm$^2$. The adhesive strength is between 1 N/mm and 20 N/mm, in particular between 3 N/mm to 10 N/mm and thus prevents undesired delamination of these layers. For the second adhesive layer 3a, a different adhesive can be used which permits a high degree of adhesive strength between the covering layer 4 and the thin-film encapsulation 5. This embodiment is particularly suitable if the first adhesive layer 3 has an inadequate adhesive property or one of the active layers, e.g., of an OLED has a lower degree of adhesion than the first adhesive layer.

Figure 6B:
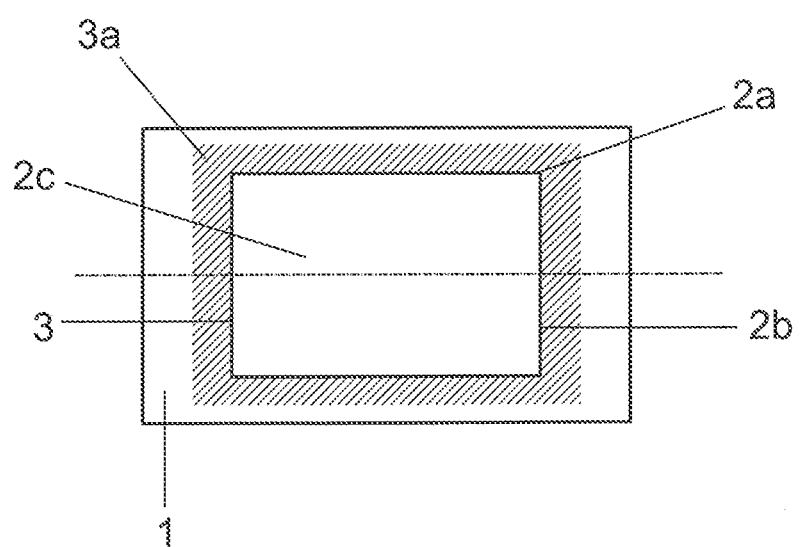

FIG. 6B shows a top view of the device already shown in FIG. 6A. FIG. 6B shows that the active layer 2 is applied centrally over a part of the main surface of the substrate 1. The adhesive layers 3 and 3a are arranged over the active layer 2 and cover the main surface 2c of the active layer 2, wherein the adhesive layer 3a is arranged completely circumferentially around the first adhesive layer 3 and protrudes beyond the edges 2a of the active layer 2. A cross-section along the dotted line produces the schematic sectional illustration of the device in accordance with FIG. 6A.

Figure 7:
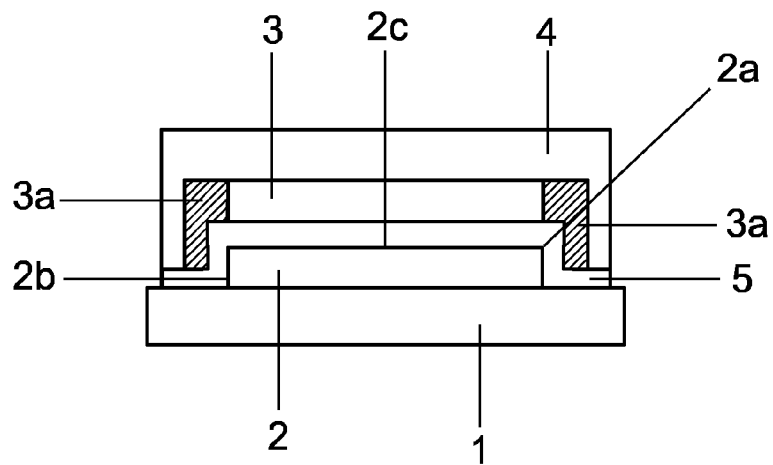
FIGS. 7 to 9 show schematic sectional illustrations in each case of an organic electronic device according to different exemplified embodiments.

In contrast to the exemplified embodiment in accordance with FIG. 6A, the exemplified embodiment in accordance with FIG. 7 shows that the covering layer 4 is arranged in addition above the lateral surfaces of the second adhesive layer 3a. Since in the case of this embodiment the lateral surfaces of the adhesive layer 3a are covered by the covering layer 4, the lateral surfaces 2b of the active layer 2 are more effectively protected against moisture and air. Since the adhesive layer 3a does not have any getter particles and thus possibly does not offer the lateral surfaces 2b of the active layer 2 adequate protection against environmental influences, this embodiment is particularly suitable in these cases.

Figure 8:
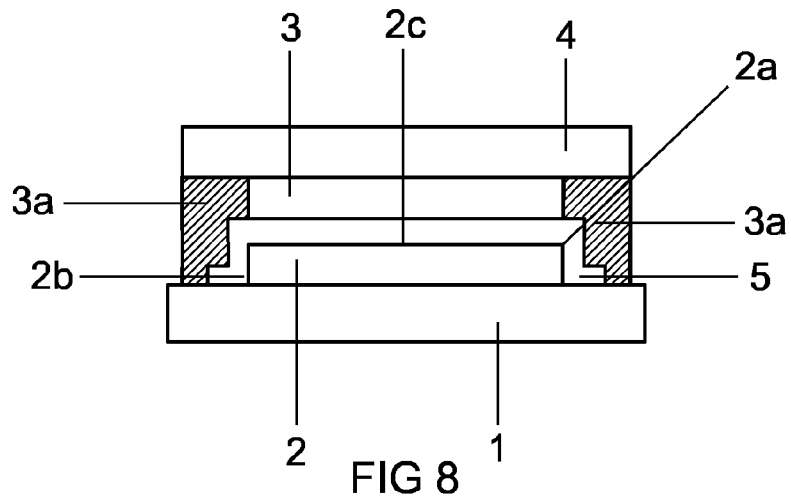

In contrast to the exemplified embodiment in accordance with FIG. 6A, the exemplified embodiment in accordance with FIG. 8 shows that the adhesive layer 3a still partially covers the main surface of the substrate 1 which is adjacent to the active layer 2.

Figure 9:
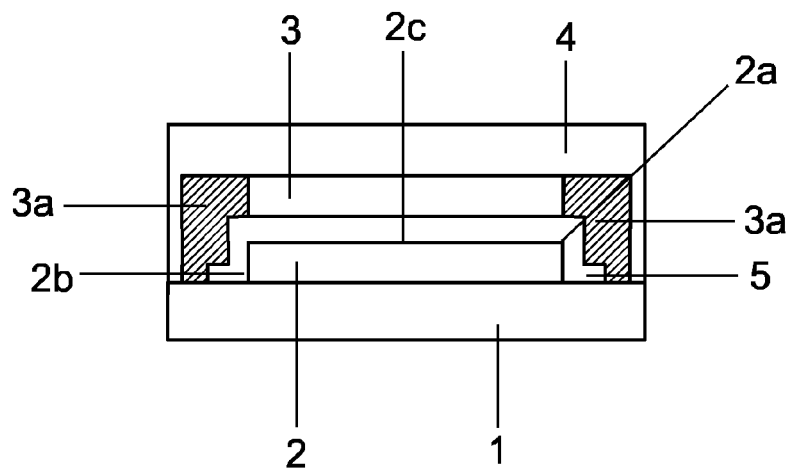

In the exemplified embodiment in accordance with FIG. 9, in contrast to the exemplified embodiment in accordance with FIG. 8, the covering layer 4 is also arranged above the lateral surfaces of the adhesive layer 3a. If the covering layer 4 comprises glass, the covering layer 4 is adhered to the substrate 1 by glass frits. In a similar manner to the exemplified embodiment in accordance with FIG. 7, the lateral surfaces of the adhesive layer 3a are covered by the covering layer 4, in order to protect the lateral surfaces 2b of the active layer 2 more effectively against moisture and air. In particular, if the adhesive layer 3a does not offer adequate protection to the lateral surfaces 2b of the active layer 2, this embodiment is suitable.

All of the exemplified embodiments shown in FIGS. 6A, 6B and 7 to 9 are also possible with interchanged arrangements of the first adhesive layer 3 and the second adhesive layer 3a. By arranging the first adhesive layer 3 above the sub-regions of the thin-film encapsulation which cover the edges 2a and the lateral surfaces 2b of the active layer 2, moisture only penetrates in a retarded manner via the lateral surfaces 2b into the active layer 2 and at the same time a high degree of adhesive strength of the thin-layer encapsulation 5 and the covering layer 4 is achieved by the second adhesive layer 3a.

The invention is not limited by the description using the exemplified embodiments. Rather, the invention includes any new feature and any combination of features what includes in particular any combination of features in the claims, even if this feature or this combination itself is not explicitly stated in the claims or exemplified embodiments.

The invention claimed is:
1. An organic electronic device comprising:
a substrate;
an active layer disposed on the substrate;
a thin-layer encapsulation directly disposed on the active layer;
a first adhesive layer disposed on the thin-layer encapsulation, wherein the first adhesive layer comprises a getter material;
a covering layer directly disposed on the first adhesive layer; and
a second adhesive layer arranged circumferentially around the first adhesive layer, wherein the second adhesive layer is free of the getter material,
wherein the active layer has edges, lateral surfaces and a main surface facing away from the substrate, wherein the thin-layer encapsulation covers the lateral surfaces and the main surface of the active layer facing away from the substrate, wherein the second adhesive layer covers lateral surfaces of the thin-layer encapsulation and a main surface of the thin-layer encapsulation partly, wherein a thickness of the thin-layer encapsulation is between 10 nm and 500 nm, and wherein the covering layer is a metal foil or a plastic foil.

2. The device as claimed in claim 1, wherein the getter material comprises zeolites.

3. The device as claimed in claim 1, wherein the first adhesive layer additionally comprises heat-conducting particles.

4. The device as claimed in claim 1, wherein the first adhesive layer covers edges or lateral surfaces of the active layer.

5. The device as claimed in claim 1, wherein the organic electronic device comprises an organic light-emitting diode, wherein the active layer of the organic light-emitting diode is configured to emit radiation, wherein the first adhesive layer is arranged in a beam path of the active layer, and wherein getter particles have a scattering effect in relation to the radiation of the active layer.

6. The device as claimed in claim 1, wherein lateral surfaces of the second adhesive layer are completely covered by the covering layer.

7. The device as claimed in claim 1, wherein outer lateral surface of the second adhesive layer are completely free of the covering layer.

8. The device as claimed in claim 1, wherein the thin-layer encapsulation comprises one of the following materials: aluminum oxide, zinc oxide, zirconium oxide, titanium oxide, hafnium oxide, lanthanum oxide, silicon oxide, and silicon nitride.

9. An organic electronic device comprising:
a substrate;
an active layer disposed on the substrate, wherein the active layer has edges, lateral surfaces and a main surface facing away from the substrate;
a thin-layer encapsulation directly disposed on the active layer, wherein the thin-layer encapsulation covers the lateral surfaces and the main surface of the active layer;
a first adhesive layer disposed on the thin-layer encapsulation, wherein the first adhesive layer comprises a getter material, an adhesive material and scatter particles, wherein the getter material comprises second particles, the second particles having a scattering effect on radiation generated in the active layer; and
a covering layer directly disposed on the first adhesive layer such that lateral surfaces of the first adhesive layer are covered by the covering layer, wherein the active layer has edges, lateral surfaces and a main surface facing away from the substrate, wherein the thin-layer encapsulation covers the lateral surfaces and the main surface of the active layer facing away from the substrate, wherein a second adhesive layer covers lateral surfaces of the thin-layer encapsulation and a main surface of the thin-layer encapsulation partly, wherein the covering layer covers lateral surfaces of the second adhesive layer, wherein the covering layer is in direct contact with the substrate, wherein a thickness of the thin-layer encapsulation is between 10 nm and 500 nm, wherein the covering layer is a metal foil or a plastic foil, and wherein the thin-layer encapsulation comprises one of the following materials: aluminum oxide, zinc oxide, zirconium oxide, titanium oxide, hafnium oxide, lanthanum oxide, silicon oxide, and silicon nitride.

10. The device as claimed in claim 9, wherein the active layer has edges and lateral surfaces and a main surface facing away from the substrate, and wherein the thin-layer encapsulation covers the edges or the lateral surfaces and the main surface of the active layer.

11. The device as claimed in claim 9, wherein the first adhesive layer covers edges or lateral surfaces of the active layer.

12. The device as claimed in claim 9, wherein the covering layer is adhered to the substrate by glass frits.

* * * * *